United States Patent [19]

Cordini et al.

[11] Patent Number: 5,483,189

[45] Date of Patent: Jan. 9, 1996

[54] INPUT/OUTPUT ADAPTED TO OPERATE WITH LOW AND HIGH VOLTAGES

[75] Inventors: Paolo Cordini; Giorgio Pedrazzini, both of Pavia; Domenico Rossi, Cilavegna, all of Italy

[73] Assignee: SGS-Thomson Microelectronics S.r.l., Agrate Brianza, Italy

[21] Appl. No.: 332,831

[22] Filed: Oct. 31, 1994

[30] Foreign Application Priority Data

Oct. 29, 1993 [EP] European Pat. Off. .............. 93830438

[51] Int. Cl.$^6$ .................................................. H03K 5/153
[52] U.S. Cl. .................... 327/333; 327/77; 327/78; 327/319; 327/320; 327/324
[58] Field of Search ............................... 327/77, 78, 319, 327/320, 324, 333

[56] References Cited

U.S. PATENT DOCUMENTS 5,258,663  11/1993  Tanaki .................... 327/319

FOREIGN PATENT DOCUMENTS

| | | | |
|---|---|---|---|
| 1067027 | 3/1989 | Japan | 327/333 |
| 0468209 | 1/1992 | Japan | 327/333 |
| 4266216 | 9/1992 | Japan | 327/333 |

OTHER PUBLICATIONS

IBM Tech Disc Bul. "5-Volt signal level shifter in a 3-volt CMOS circuit" vol. 32, No. 7, Dec. 1989 pp. 454-455.

*Primary Examiner*—Margaret Rose Wambach
*Attorney, Agent, or Firm*—Robert Groover; Betty Formby

[57] ABSTRACT

A stage of both input and output configurable for operation with low and high voltages, comprises:

first (M1), second (M2) and third (M3) transistors, each having first and second terminals and a control terminal, the first and second terminals and control terminal of the first transistor (M1) being respectively connected to a first terminal of a voltage supply, the first terminal of the second transistor (M2), and a drive circuit means, the second terminal and control terminal of the second transistor (M2) being respectively connected to a circuit node (A), forming an input/output terminal of the stage (1), and to the drive circuit means, the first and second terminals and control terminal of the third transistor (M3) being respectively connected to a second terminal of the voltage supply, the circuit node (A), and the drive circuit means;

at least one diode (D2) connected between the first and the second terminal of the second transistor (M2); and an input circuit (3) having a first input terminal connected to the circuit node (A), a second input terminal connected to a reference voltage (Vref3), and at least one output terminal forming an output terminal of the stage (I).

33 Claims, 1 Drawing Sheet

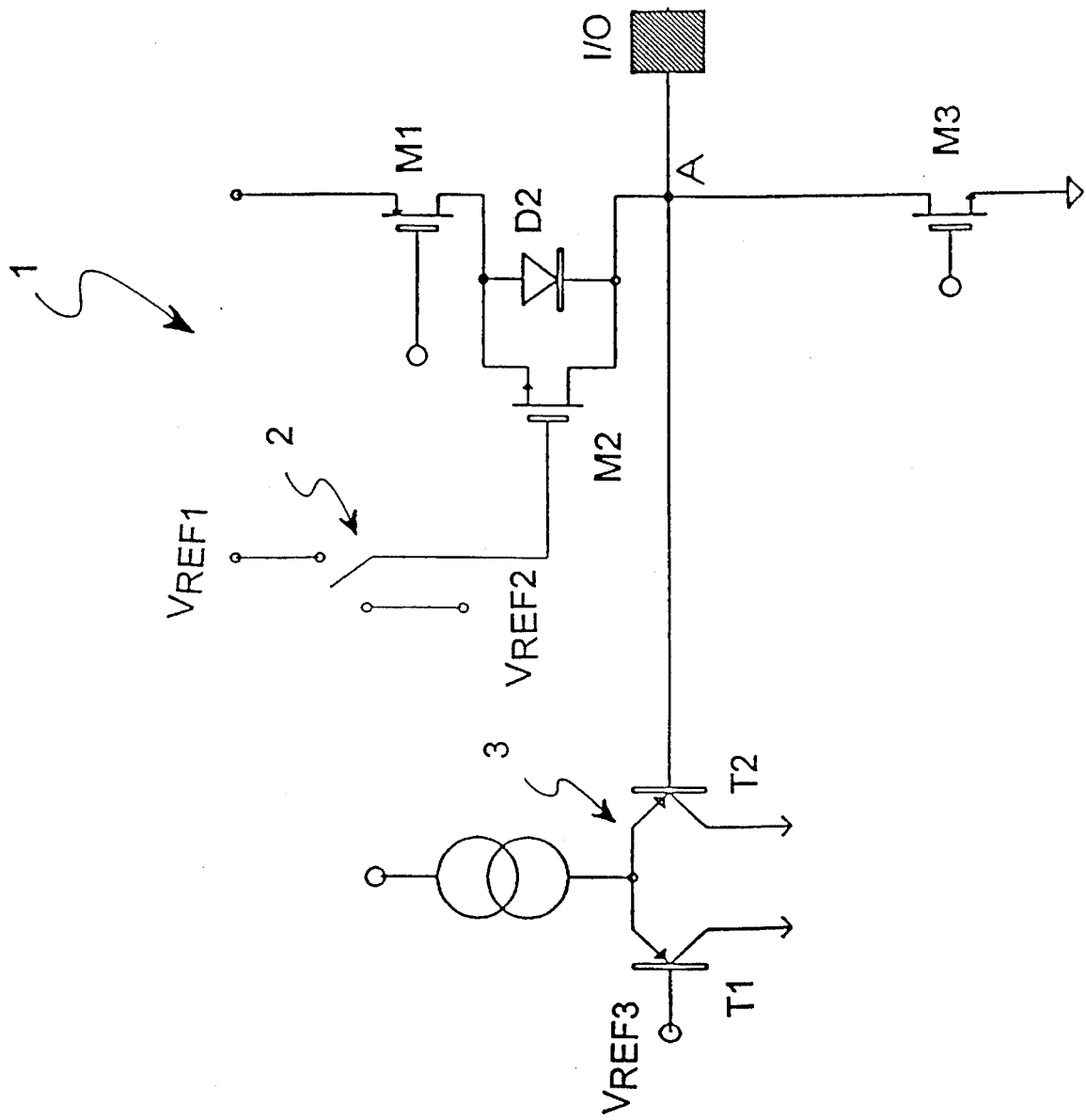

5,483,189

INPUT/OUTPUT ADAPTED TO OPERATE WITH LOW AND HIGH VOLTAGES

CROSS-REFERENCE TO RELATED APPLICATION

This application claims priority from EPC App'n 93830438.3, filed Oct. 29, 1993, which is hereby incorporated by reference.

BACKGROUND AND SUMMARY OF THE INVENTION

This invention relates to input and output devices, in particular a stage of both input and output which may be configured to operate with low and high voltages.

It is well recognized that standard input and output stages have some limitations to their operation which are mainly brought about by the technologies employed in their making.

Specifically, the input and output stages are implemented in technologies which forbid implementation on the same chip of circuit portions which operate with low voltages and circuit portions which operate with high voltages.

The technical problem underlining the present invention is that of realizing a mixed technology stage of both input and output which may be configured to operate with low and high voltages.

In fact, by using a mixed technology, both low and high voltage circuit portions can be implemented on one chip.

The above technical problem is solved by a stage of both input and output in which—in addition to a DMOS pull-down device and a PMOS pull-up device—an additional DMOS device is interposed between the output node and the pull-up device. By turning on the additional DMOS device, the stage can be operated as a push-pull output; by turning off the additional DMOS device, the stage can be operated as an open-collector stage (with the intrinsic diode of the additional DMOS device providing protection for the pull-up device).

BRIEF DESCRIPTION OF THE DRAWING

The disclosed inventions will be described with reference to the accompanying drawings, which show important sample embodiments of the invention and which are incorporated in the specification hereof by reference, wherein:

The single FIGURE of the drawing shows a circuit diagram for a stage of both input and output according to the invention.

DETAILED DESCRIPTION OF THE PREFERRED EMBODIMENTS

The numerous innovative teachings of the present application will be described with particular reference to the presently preferred embodiment (by way of example, and not of limitation), in which:

The circuit layout of a stage (1) for both input and output is shown in the drawing as it would be implemented in mixed technology. The stage comprises a first transistor (M1) of the P-channel MOS type, and second (M2) and third (M3) transistors of the N-channel DMOS type which can be operated with a high voltage, each of the aforesaid three transistors having a source terminal, a drain terminal, and a gate terminal.

Specifically, the source, drain, and gate terminals of the first transistor (M1) are connected respectively to a first terminal of a voltage supply, the source terminal of the second transistor (M2), and a drive means which is only partly depicted in the drawing.

The drain and gate terminals of the second transistor (M2) are connected to a circuit node (A) forming an input/output terminal for the stage (1), and to a drive means, respectively, while the source, drain, and gate terminals of the third transistor (M3) are respectively connected to a second terminal of the voltage supply which is at a lower potential than the first, the circuit node (A), and a drive means.

Such drive means comprise at least one switching circuit means (2) which alternately connects the gate terminal of the second transistor (M2) to first (Vref1) and second (Vref2) reference potentials, with (Vref1) being a higher potential than (Vref2). (For example, in a sample embodiment with a 5V supply voltage, Vref1 may be 10V while Vref2 is 5V.)

Connected between the source terminal and the drain terminal of the second transistor (M2) is a diode (D2) which is intrinsic to the integrated structure of the second transistor (M2) and may be operated even with a high voltage.

Note that M2 has its source (rather than its drain) connected to M1, to provide the desired orientation of the intrinsic diode.

The circuit layout of the stage (1) further comprises an input circuit (3) having a first input terminal connected to the circuit node (A), a second input terminal connected to a reference voltage (Vref3), and at least one output terminal forming an output terminal of the stage (1).

The input circuit (3) is a circuit arrangement of the differential type comprising first (T1) and second (T2) bipolar transistors of the PNP type.

The operation of the stage (1) of both input and output, according to the invention, will now be discussed.

When used as an output stage, this stage (1) may be either operated in a push-pull configuration of the CMOS type or in an open-drain configuration.

Operation of the stage (1) in the push-pull configuration of the CMOS type is obtained by turning on the second transistor (M2) through the connection of its gate terminal to the first reference potential (Vref1), via the switching circuit means (2).

In this way, the diode (D2) will be shorted by that transistor (M2), and the first and third transistors (M1) and (M3) can, if driven in phase opposition through the drive circuit means connected to their respective gate terminals (not shown in the drawing), operate in the push-pull configuration of the CMOS type.

In the push-pull configuration of the CMOS type, the stage (1) will operate with low output voltages. Operation of the stage (1) in the open-drain configuration is obtained by turning on the first transistor (M1) through the drive circuit means (not shown in the drawing) connected to its gate terminal, and connecting the gate terminal of the second transistor (M2) to the second reference potential (Vref2) through the switching circuit means (2).

Thus, the second transistor (M2) is turned off, and the diode (D2) disconnects that transistor from the node (A) when the circuit node (A), functioning as the output terminal of the stage (1), is connected to a load which is supplied a higher voltage than that present at the drain terminal of the first transistor (M1).

The third transistor (M3) can then operate in the open-drain configuration even with high output voltages. In order to utilize the stage (1) as an input stage, the first, second and third transistors (M1), (M2) and (M3) are turned off through the drive means connected to their respective gate terminals, and the differential circuit arrangement shown at (3) is used as the input circuit.

Of course, the power NMOS devices M2 and M3 are preferably isolated from each other.

As an input stage, the stage (1) may be operated with either low or high voltages.

While one embodiment of the invention has been described and illustrated, variations and modifications thereof are possible within the scope of this inventive concept. For example, a wide variety of other differential or single-ended MOS or bipolar stages may be used instead of or in addition to the illustrated input stage 3. For another example, while the "BCD" (bipolar/CMOS/DMOS) process of SGS-Thomson is contemplated as one suitable process, the invention can also be used with any other mixed technology which includes power devices (especially DMOS power devices).

For another example, it may be possible to substitute other device technologies (such as IGBT or buried-emitter bipolar devices) for the DMOS devices of the presently preferred embodiment, as long as the foregoing functional relations are maintained. However, the use of DMOS devices is believed to be particularly advantageous. In particular, the use of a "reversed" n-channel DMOS device on the pull-up side of the stage is believed to be particularly advantageous. However, in other embodiments this feature can optionally be omitted, although this is less preferable.

Similarly, it is also possible to provide other structures for the input buffer. However, it should be noted that the use of bipolar transistors rather than FETs can be advantageous, due to their ability to pass low-current overvoltage transients without permanent damage.

According to a disclosed class of innovative embodiments, there is provided: An integrated circuit, comprising: a first transistor, having current-carrying terminals operatively connected in series between an output terminal and a first power supply connection; a second transistor, having current-carrying terminals operatively connected to be interposed between said output terminal and said first transistor, said first and second transistors being of opposite conductivity types; a third transistor, connected between said output terminal and a second power supply connection which is less positive than said first power supply connection; and selection circuitry operatively connected to selectably apply a first constant voltage to turn on said second transistor to enable push-pull operation of said first and third transistors to drive said output node, or a second constant voltage to turn off said second transistor to enable open-collector operation of said third transistor to drive said output node.

According to another disclosed class of innovative embodiments, there is provided: An integrated circuit, comprising: a first P-channel field-effect transistor, operatively connected in series between an output terminal and a first power supply connection; a second transistor, which is an N-channel power field-effect transistor with an intrinsic source/drain diode, having current-carrying terminals operatively connected to be interposed between said output terminal and said first transistor, said first and second transistors being of opposite conductivity types; a third N-channel power field-effect transistor, connected between said output terminal and a second power supply connection which is less positive than said first power supply connection; and selection circuitry operatively connected to selectably apply a first constant voltage to turn on said second transistor to enable push-pull operation of said first and third transistors to drive said output node, or a second constant voltage to turn off said second transistor to enable open-collector operation of said third transistor to drive said output node.

According to another disclosed class of innovative embodiments, there is provided: An integrated circuit, comprising: a first transistor, having current-carrying terminals operatively connected in series between an output terminal and a first power supply connection; a second transistor, having current-carrying terminals operatively connected to be interposed between said output terminal and said first transistor, said first and second transistors being of opposite conductivity types; a third transistor, connected between said output terminal and a second power supply connection which is less positive than said first power supply connection; selection circuitry operatively connected to selectably apply a first constant voltage to turn on said second transistor to enable push-pull operation of said first and third transistors to drive said output node, or a second constant voltage to turn off said second transistor to enable open-collector operation of said third transistor to drive said output node; and input-buffer circuitry connected to amplify the voltage on said output terminal when said second and third transistors are off.

According to another disclosed class of innovative embodiments, there is provided: A method for operating an input/output stage to selectably drive an output node, comprising the steps of: providing an output stage which includes a first transistor, having current-carrying terminals operatively connected in series between an output terminal and a first power supply connection; a second transistor, having current-carrying terminals operatively connected to be interposed between said output terminal and said first transistor, said first and second transistors being of opposite conductivity types; and a third transistor, connected between said output terminal and a second power supply connection which is less positive than said first power supply connection; when push-pull operation is selected, turning on said second transistor, and driving said first and third transistors with opposed phases to provide a signal on said output node; when open-collector operation is selected, turning off said second transistor, and driving said third transistor to provide a signal on said output node; and when input from said output terminal is selected, turning off said second and third transistors.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit, comprising:

a first transistor, having current-carrying terminals operatively connected in series between an output terminal and a first power supply connection;

a second transistor, having current-carrying terminals operatively connected to be interposed between said output terminal and said first transistor, said first and second transistors being of opposite conductivity types;

a third transistor, connected between said output terminal and a second power supply connection which is less positive than said first power supply connection; and selection circuitry operatively connected to selectably apply a first constant voltage to turn on said second transistor to enable push-pull operation of said first and third transistors to drive said output node, or a second constant voltage to turn off said second transistor to enable open-collector operation of said third transistor to drive said output node.

2. The integrated circuit of claim 1, wherein said second transistor is an N-channel transistor having a SOURCE thereof connected to said output terminal.

3. The integrated circuit of claim 1, further comprising input-buffer circuitry which is connected to amplify the voltage on said output terminal when said second and third transistors are off, and which comprises at least one bipolar transistors having one base terminal connected to said output terminal.

4. The integrated circuit of claim 1, further comprising input-buffer circuitry which is connected to amplify the voltage on said output terminal when said second and third transistors are off, and which comprises a balanced pair of PNP bipolar transistors having one base terminal connected to said output terminal.

5. The integrated circuit of claim 1, wherein said second transistor is an N-channel DMOS transistor.

6. The integrated circuit of claim 1, wherein said second power supply connection is chip ground.

7. An integrated circuit, comprising:

a first P-channel field-effect transistor, operatively connected in series between an output terminal and a first power supply connection;

a second transistor, which is an N-channel power field-effect transistor with an intrinsic source/drain diode, having current-carrying terminals operatively connected to be interposed between said output terminal and said first transistor, said first and second transistors being of opposite conductivity types;

a third N-channel power field-effect transistor, connected between said output terminal and a second power supply connection which is less positive than said first power supply connection; and selection circuitry operatively connected to selectably apply a first constant voltage to turn on said second transistor to enable push-pull operation of said first and third transistors to drive said output node, or a second constant voltage to turn off said second transistor to enable open-collector operation of said third transistor to drive said output node.

8. The integrated circuit of claim 7, wherein said second transistor is an N-channel transistor having a SOURCE thereof connected to said output terminal.

9. The integrated circuit of claim 7, further comprising input-buffer circuitry which is connected to amplify the voltage on said output terminal when said second and third transistors are off, and which comprises at least one bipolar transistors having one base terminal connected to said output terminal.

10. The integrated circuit of claim 7, further comprising input-buffer circuitry which is connected to amplify the voltage on said output terminal when said second and third transistors are off, and which comprises a balanced pair of PNP bipolar transistors having one base terminal connected to said output terminal.

11. The integrated circuit of claim 7, wherein said second transistor is an N-channel DMOS transistor.

12. The integrated circuit of claim 7, wherein said second power supply connection is chip ground.

13. An integrated circuit, comprising:

a first transistor, having current-carrying terminals operatively connected in series between an output terminal and a first power supply connection;

a second transistor, having current-carrying terminals operatively connected to be interposed between said output terminal and said first transistor, said first and second transistors being of opposite conductivity types;

a third transistor, connected between said output terminal and a second power supply connection which is less positive than said first power supply connection;

selection circuitry operatively connected to selectably apply a first constant voltage to turn on said second transistor to enable push-pull operation of said first and third transistors to drive said output node, or a second constant voltage to turn off said second transistor to enable open-collector operation of said third transistor to drive said output node; and input-buffer circuitry connected to amplify the voltage on said output terminal when said second and third transistors are off.

14. The integrated circuit of claim 13, wherein said input-buffer circuitry comprises at least one bipolar transistor having a base terminal connected to said output terminal.

15. The integrated circuit of claim 13, wherein said input-buffer circuitry comprises a balanced pair of PNP bipolar transistors having one base terminal connected to said output terminal.

16. The integrated circuit of claim 13, wherein said second transistor is an N-channel transistor having a SOURCE thereof connected to said output terminal.

17. The integrated circuit of claim 13, further comprising input-buffer circuitry which is connected to amplify the voltage on said output terminal when said second and third transistors are off, and which comprises at least one bipolar transistors having one base terminal connected to said output terminal.

18. The integrated circuit of claim 13, further comprising input-buffer circuitry which is connected to amplify the voltage on said output terminal when said second and third transistors are off, and which comprises a balanced pair of PNP bipolar transistors having one base terminal connected to said output terminal.

19. The integrated circuit of claim 13, wherein said second transistor is an N-channel DMOS transistor.

20. The integrated circuit of claim 13, wherein said second power supply connection is chip ground.

21. A stage of both input and output configurable for operation with low and high voltages, comprising:

first, second and third transistors, each having first and second terminals and a control terminal, the first and second terminals and control terminal of the first transistor being respectively connected to a first terminal of a voltage supply, the first terminal of the second transistor, and a drive circuit means, the second terminal and control terminal of the second transistor being respectively connected to a circuit node, forming an input/output terminal of the stage, and to the drive circuit means, the first and second terminals and control terminal of the third transistor being respectively connected to a second terminal of the voltage supply, the circuit node, and the drive circuit means;

at least one diode connected between the first and the second terminal of the second transistor; and an input circuit having a first input terminal connected to the circuit node, a second input terminal connected to a reference voltage, and at least one output terminal forming an output terminal of the stage.

22. An input/output stage according to claim 21, characterized in that the drive circuit means comprises at least one switching circuit means adapted to alternately connect the control terminal of the second transistor to a first and a second reference potential.

23. An input/output stage according to claim 21, characterized in that the input circuit of the stage is a circuit arrangement of the differential type.

24. An input/output stage according to claim 21, wherein the differential arrangement comprises bipolar transistors of the PNP type.

25. An input/output stage according to claim 21, implemented in mixed technology, wherein said first transistor is a P-channel MOS transistor and the second and third transistors are N-channel DMOS transistors.

26. An input/output stage according to claim 21, wherein said first and second terminals and control terminals of the first, second and third transistors are source, drain and gate terminals, respectively.

27. An input/output stage according to claim 21, wherein said diode is an intrinsic diode to the integrated structure of the second transistor.

28. A method for operating an input/output stage to selectably drive an output node, comprising the steps of:
   (a.) providing an output stage which includes
      a first transistor, having current-carrying terminals operatively connected in series between an output terminal and a first power supply connection;
      a second transistor, having current-carrying terminals operatively connected to be interposed between said output terminal and said first transistor, said first and second transistors being of opposite conductivity types; and
      a third transistor, connected between said output terminal and a second power supply connection which is less positive than said first power supply connection;
   (b.) when push-pull operation is selected, turning on said second transistor, and driving said first and third transistors with opposed phases to provide a signal on said output node;
   (c.) when open-collector operation is selected, turning off said second transistor, and driving said third transistor to provide a signal on said output node; and
   (d.) when input from said output terminal is selected, turning off said second and third transistors.

29. The method of claim 28, wherein said second transistor is an N-channel transistor having a SOURCE thereof connected to said output terminal.

30. The method of claim 28, wherein input-buffer circuitry is connected to amplify the voltage on said output terminal when said second and third transistors are off, and comprises at least one bipolar transistors having one base terminal connected to said output terminal.

31. The method of claim 28, wherein input-buffer circuitry is connected to amplify the voltage on said output terminal when said second and third transistors are off, and comprises a balanced pair of PNP bipolar transistors having one base terminal connected to said output terminal.

32. The method of claim 28, wherein said second transistor is an N-channel DMOS transistor.

33. The method of claim 28, wherein said second power supply connection is chip ground.

* * * * *